US007843236B2

(12) United States Patent
Chang et al.

(10) Patent No.: US 7,843,236 B2

(45) Date of Patent: Nov. 30, 2010

(54) LOW VOLTAGE DIFFERENTIAL SIGNAL RECEIVER

(75) Inventors: Chen-Yuan Chang, HsinChu (TW); Hsien-Sheng Huang, HsinChu (TW)

(73) Assignee: Etron Technology, Inc., Hsinchu (TW)

( * ) Notice: Subject to any disclaimer, the term of this patent is extended or adjusted under 35 U.S.C. 154(b) by 354 days.

(21) Appl. No.: 12/153,734

(22) Filed: May 23, 2008

(65) Prior Publication Data

US 2009/0021284 A1 Jan. 22, 2009

(30) Foreign Application Priority Data

Jul. 20, 2007 (TW) .............................. 96126626 A

(51) Int. Cl.
*H03B 1/00* (2006.01)

(52) U.S. Cl. ......................... 327/108; 327/65; 327/112; 326/14

(58) Field of Classification Search ............. 327/63–66, 327/108, 112, 170, 391; 326/26, 27, 82, 326/83, 14
See application file for complete search history.

(56) References Cited

U.S. PATENT DOCUMENTS 6,977,534 B2 * 12/2005 Radelinow .................. 327/108
7,696,793 B2 * 4/2010 Sunairi ....................... 327/108

* cited by examiner

*Primary Examiner*—Long Nguyen
(74) *Attorney, Agent, or Firm*—Muncy, Geissler, Olds & Lowe, PLLC

(57) ABSTRACT

The invention discloses a low voltage differential signal (LVDS) receiver, which is realized in an integrated circuit. The LVDS receiver includes: an input stage circuit receiving a full-range common-mode voltage and converting it into a current signal; a current source circuit coupled to the input stage circuit to provide a current source; and a current mirror circuit coupled the input stage circuit and the current source circuit to provide several bias voltage signals for the current source circuit and output a voltage signal to a buffer.

14 Claims, 4 Drawing Sheets

LOW VOLTAGE DIFFERENTIAL SIGNAL RECEIVER

BACKGROUND OF THE INVENTION

1. Field of the Invention

The present invention relates to a signal receiver, particularly to a low voltage differential signal receiver.

2. Description of the Related Art

The requirement for high speed data transmission is pushing the interface technology toward the high-speed, serial, differential, low power consumption, and point-to-point interface. The LVDS (Low Voltage Differential Signal) technology exactly has all the features a high speed data transmission needs. LVDS is a universal transmission protocol and has been extensively used in the systems requiring the integrity, low-jitter, and common-mode characteristics of signals, especially in the high-speed data transmission in communication systems and display interfaces.

A transmission interface usually needs many sets of LVDS transmitters, and each set of LVDS needs a receiver to receive and amplify weak differential signals. Then, the differential signals are transmitted into a chip for further signal processing.

A common LVDS receiver uses only two NMOS (Negative-channel Metal-Oxide Semiconductor) or PMOS (Positive-channel Metal-Oxide Semiconductor) transistors to sense differential signals and is hard to completely receive the differential signals having a higher or lower common mode voltage. An "LVDS I/O Interface for Gb/s-per-pin Operation in 3.5 um CMOS", which was published in IEEE journal of Solid State Circuits, disclosed an LVDS receiver using a preamplifier to receive and amplify weak differential signals and using a regenerative circuit to pull up the differential signals to a full range. Each preamplifier needs an additional bias circuit, and the bias circuits consume a large proportion of power.

In a high speed data transmission circuit, the transmitter transmits signals to the receiver at another side via transmission wires. When the transmitter shuts down and no more outputs signals, the receiver will receive over 20 mV differential noise via the transmission wires, which will interfere with the operation of the recipient-side circuit.

In a common fail-safe circuit, a voltage-division resistor generates a tiny voltage difference to function as the offset voltage of the recipient side to overcome differential noise. Refer to FIG. 1. A pull-up resistor $R_{PU}$ and a pull-down resistor $R_{PD}$ are arranged before a conventional LVDS receiver 1 and respectively connected to two transmission wires to perform a voltage division function. Such a fail-safe circuit, which uses resistors to divide voltage and form offset voltage, has a drawback that the circuit needs additional resistors to divide voltage. If the voltage-division resistors are realized in a printed circuit board, the complexity and cost of the printed circuit board will increase. The conventional fail-safe circuit also has a drawback that the voltage-division resistors can only generate unidirectional compensation. Thus, the positive input terminal of the receiver always has an offset voltage greater than the negative input terminal, which results in the signal duty-cycle drift at the output side of the receiver, especially at a low-frequency signal transmission.

SUMMARY OF THE INVENTION

One objective of the present invention is to provide a low voltage differential signal receiver, which uses an NMOS (Negative-channel Metal-Oxide Semiconductor) input pair and a PMOS (Positive-channel Metal-Oxide Semiconductor) input pair to receive a tiny differential signal and thus can sense a full-range differential signal of common-mode voltage, including the differential signal of a higher or lower common-mode voltage, whereby the signal receiving capability of a rail-to-rail receiver is promoted.

Another objective of the present invention is to provide a low voltage differential signal receiver, wherein the circuit of the receiver has a self-bias function, which can save additional bias circuits, reduce power consumption, and decrease layout area, and wherein the circuit of the receiver transmits current via a current mirror but not via a cascaded circuit needing a higher Vdd, and whereby the receiver can operate at a lower voltage.

Further another objective of the present invention is to provide a low voltage differential signal receiver, wherein different amplifiers amplify the differential voltages output by the receiver to switch MOS elements, whereby the effect of differential noise is overcome without influencing the driving current output by the transmitter at another side.

In one embodiment, the LVDS (Low Voltage Differential Signal) receiver of the present invention is realized in an integrated circuit and includes: an input stage circuit converting a low voltage differential signal into a first current signal and a second current signal; a current source circuit coupled to the input stage circuit and generating a set of operating currents for the input stage circuit according to a plurality of bias signals; a current mirror circuit coupled to the current source circuit and the input stage circuit, receiving the first current signal and the second current signal to generate an output voltage signal, and outputting a plurality of bias signals to the current source circuit according to the first current signal and the second current signal.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DETAILED DESCRIPTION OF THE INVENTION

The present invention proposes an LVDS receiver, which includes: an input stage circuit receiving an LVDS and converting the LVDS into two current signals; a current source circuit coupled to the input stage circuit and generating operating current for the input stage circuit according to a plurality of bias signals; and a current mirror circuit coupled to the current source circuit and the input stage circuit, receiving the current signals to generate an output voltage signal, and outputting a plurality of bias signals to the current source circuit according to the current signals.

Figure 1:
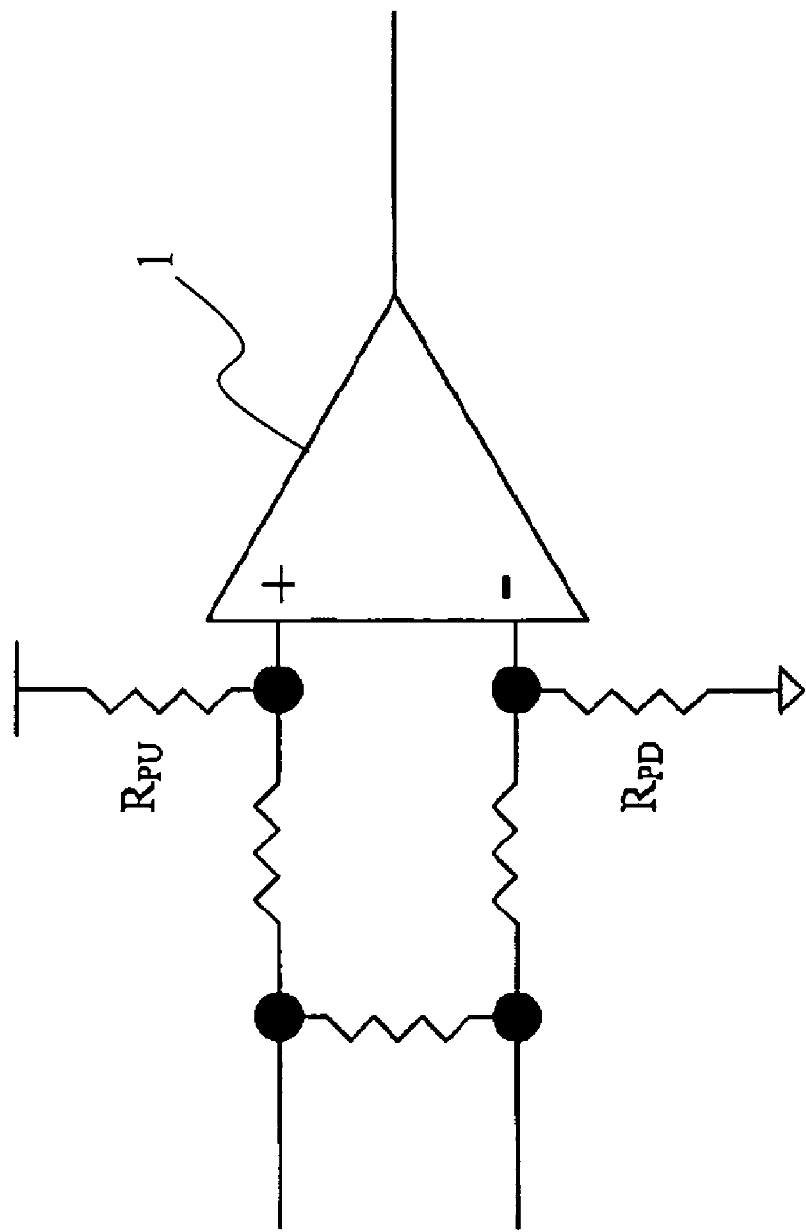
FIG. 1 is a diagram schematically showing the front-end circuit of a conventional LVDS receiver.
Figure 2:
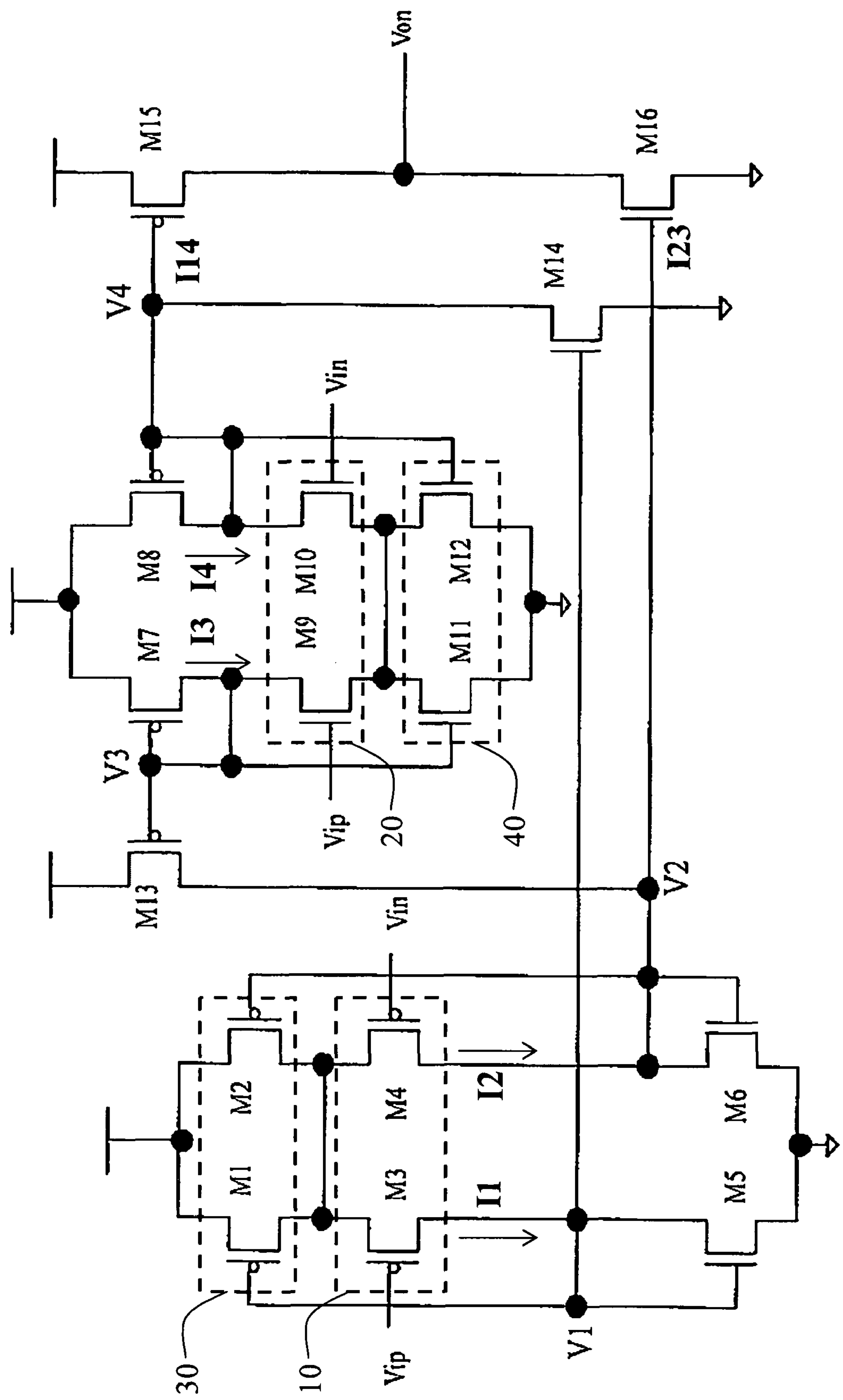
FIG. 2 is a diagram schematically showing an LVDS receiver according to one embodiment of the present invention.

Refer to FIG. 2 a diagram schematically showing an LVDS receiver according to one embodiment of the present invention. The input stage circuit further includes: a first differential signal input device 10 and a second differential signal input device 20. The first differential signal input device 10 converts LVDS into a current signal. The first differential signal input device 10 includes a pair of PMOS transistors M3 and M4. The sources of the PMOS transistors M3 and M4 are connected to each other, and the gates thereof respectively receive an LVDS Vip and an LVDS Vin. The second differential signal input device 20 converts the LVDS Vip and an LVDS Vin into a current signal. The second differential signal input device 20 includes a pair of NMOS transistors M9 and M10. The sources of the NMOS transistors M9 and M10 are connected to each other, and the gates thereof respectively receive the LVDS Vip and the LVDS Vin.

The current source circuit further includes: a first current source circuit 30 and a second current source circuit 40. The first current source circuit 30 generates operating current for the first differential signal input device 10 and includes a pair of PMOS transistors M1 and M2. The sources of the PMOS transistors M1 and M2 are connected to a voltage source, and the drains thereof are connected to each other. The second current source circuit 40 includes a pair of NMOS transistors M11 and M12. The sources of the NMOS transistors M11 and M12 are connected to a voltage source, and the drains thereof are connected to each other.

The current mirror circuit further includes: a first current mirror set and a second current mirror set. The first current mirror set is arranged in between the first and second differential signal input devices 10 and 20 and generates a first summation current signal I14 according to the current signals of the first and second differential signal input devices 10 and 20. The second current mirror set is arranged in between the first and second differential signal input devices 10 and 20 and generates a second summation current signal I23 according to the current signals of the first and second differential signal input devices 10 and 20. The current mirror circuit generates an output voltage signal Von according to the summation current signals I14 and I23.

The first current mirror set includes: a current mirror M5 receiving a current signal I1 to generate a mirroring current signal; and a current mirror M8 coupled to the current mirror M5 and generating the first summation current signal I14 according to a current signal I4 and the mirroring current signal. Further, the current mirror M5 outputs a bias signal to the first current source circuit 30 according to the current signal I1, and the current mirror M8 outputs a bias signal to the second current source circuit 40 according to the current signal I4 and the mirroring current signal.

The second current mirror set includes: a current mirror M7 receiving a current signal I3 to generate a mirroring current signal; and a current mirror M6 coupled to the current mirror M7 and generating the second summation current signal I23 according to a current signal I2 and the mirroring current signal. Further, the current mirror M7 outputs a bias signal to the second current source circuit 40 according to the current signal I3, and the current mirror M6 outputs a bias signal to the first current source circuit 30 according to the current signal I2 and the mirroring current signal.

In this embodiment, the input stage circuit receives the full-range common-mode voltage differential signals Vip and Vin. The input stage circuit includes: a PMOS input pair M3 and M4 receiving a given range of the common-mode voltage differential signals Vip and Vin and converting the differential signals Vip and Vin into a current signal; and an NMOS input pair M9 and M10 receiving a given range of the common-mode voltage differential signals Vip and Vin and converting the differential signals Vip and Vin into a current signal, wherein the range of the common-mode voltage received by the PMOS input pair M3 and M4 only partially overlaps that received by the NMOS input pair M9 and M10.

In this embodiment, an NMOS current mirror circuit M5 and M14 is coupled to the PMOS transistor M3 to receive a current signal, and then the current signal flows into the PMOS transistor M8. A PMOS current mirror circuit M7 and M13 is coupled to the NMOS transistor M9 to receive a current signal, and then the current signal flows into the NMOS transistor M6. The NMOS transistor M6 is coupled to the PMOS transistors M4 and M13 to form a diode-connected load. The current signals respectively generated by the PMOS transistor M4 and the NMOS transistor M9 can be summed up and sent to the output terminal Von through the current mirror composed of the NMOS transistors M6 and M16. Similarly, PMOS transistor M8 sums up the current signals respectively generated by the PMOS transistor M3 and the NMOS transistor M10 and sent to the output terminal Von through the current mirror composed of the PMOS transistors M8 and M15.

In this embodiment, there are two current sources—a first current source containing the PMOS transistors M1 and M2 and a second current source containing the NMOS transistors M11 and M12. The NMOS transistors M5 and M6 provide bias for the first current source, and the PMOS transistors M7 and M8 provide bias for the second current source. Then, the current source signals are output via the PMOS transistor M15 and the NMOS transistor M16 to a buffer (not shown in the drawings) containing an inverter. The buffer pulls up the current signal to the full range to function as an input signal for the next stage circuit. The next stage circuit may be a buffer formed via cascading a plurality of inverters.

The NMOS transistors M5 and M6 may function as passive loads and active current mirrors. The NMOS transistor M6 may function as a first stage load of the input terminal of the PMOS transistor M4 and a second stage load of the input terminal of the NMOS transistor M9. The PMOS transistors M7 and M8 may function as passive loads and active current mirrors. The PMOS transistor M8 may function as a first stage load of the input terminal of the NMOS transistor M10 and a second stage load of the input terminal of the PMOS transistor M3.

Thus, the present invention discloses a self-bias rail-to-rail LVDS receiver. In the present invention, an input stage circuit receives a full-range common-mode voltage differential signal and converts the differential signal into a current signal. The input stage circuit includes: a PMOS input pair M3 and M4 receiving a given range of the common-mode voltage differential signals; and an NMOS input pair M9 and M10 receiving a given range of the common-mode voltage differential signals, wherein the range of the common-mode voltage received by the PMOS input pair M3 and M4 only partially overlaps that received by the NMOS input pair M9 and M10. The PMOS input pair M3 and M4 and the NMOS input pair M9 and M10 can respectively receive the common-mode voltage signals having too high or too low a voltage. Thus, the common-mode voltage can be full-range sensed, and the receiving capability of the rail-to-rail receiver is promoted.

In the present invention, a current source circuit is coupled to the input stage circuit. The current source circuit includes: a pair of PMOS current source circuits M1 and M2 providing current for the PMOS input pair M3 and M4 and a pair of NMOS current source circuits M11 and M12 providing current for the NMOS input pair M9 and M10. A bias circuit is coupled to the input stage circuit and the current source circuit. The bias circuit includes: a pair of NMOS bias circuits M5 and M6 providing bias signals for the PMOS current source circuits M1 and M2 and a pair of PMOS bias circuits M7 and M8 providing bias signals for the NMOS current source circuits M11 and M12.

In the present invention, an output stage current includes two current mirrors. One current mirror is formed via coupling an NMOS output element M16 to the PMOS transistor M13 and the PMOS bias circuit M7. The other current mirror is formed via coupling a PMOS output element M15 to the NMOS transistor M14 and the NMOS bias circuit M5. The PMOS output element M15 and the NMOS output element M16 are cascaded together and jointly coupled to an output terminal Von and then output a voltage signal to a buffer.

In the present invention, the current mirror M5 is electrically coupled to the current mirror M6, and the current mirror M7 is electrically coupled to the current mirror M8. The current mirror M6 and the current mirror M8 is connected to a coupling point to output a voltage signal Von. A buffer (not shown in the drawings) receives the output voltage signal Von and generates an amplified voltage signal.

In the present invention, the LVDS is divided into two input voltage signals. The LVDS receiver of the present invention further includes a fail-safe circuit coupled to the current mirror circuits 30 and 40. When the absolute value of the difference between the two input voltage signals is greater than a predetermined value, the fail-safe circuit will switch the output voltage signal from an original predetermined value to another predetermined value. When the absolute value of the difference between the two input voltage signals is less than the predetermined value, the fail-safe circuit will maintain the output voltage signal at the original predetermined value.

Figure 3B:
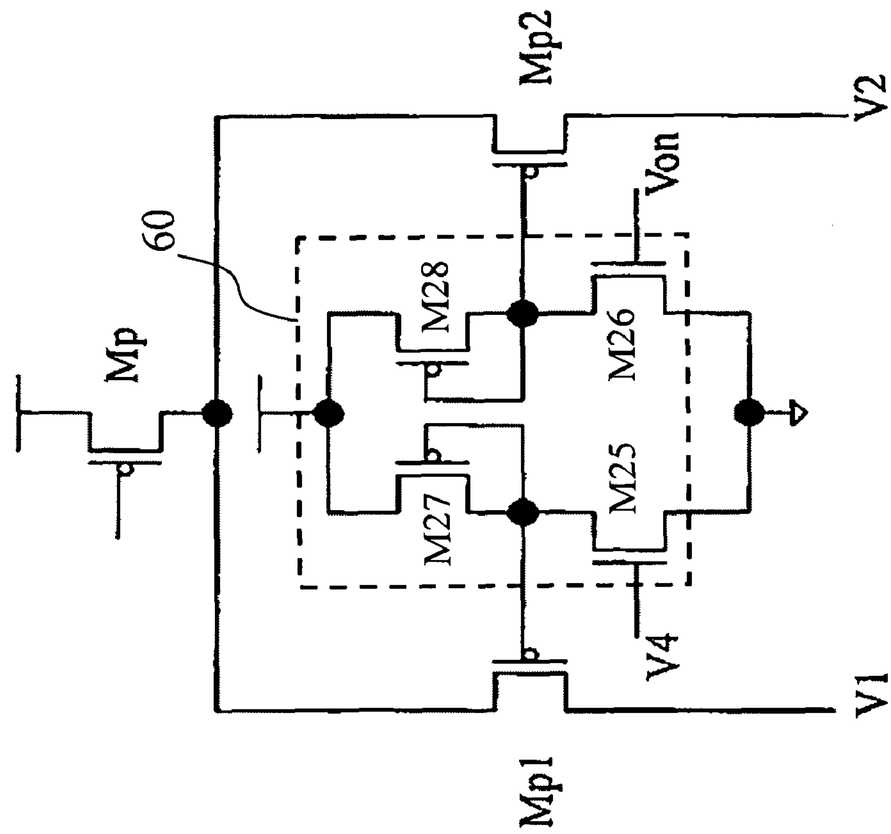
FIG. 3A and FIG. 3B are diagrams schematically showing a fail-safe circuit of an LVDS receiver according to one embodiment of the present invention.
Figure 3A:
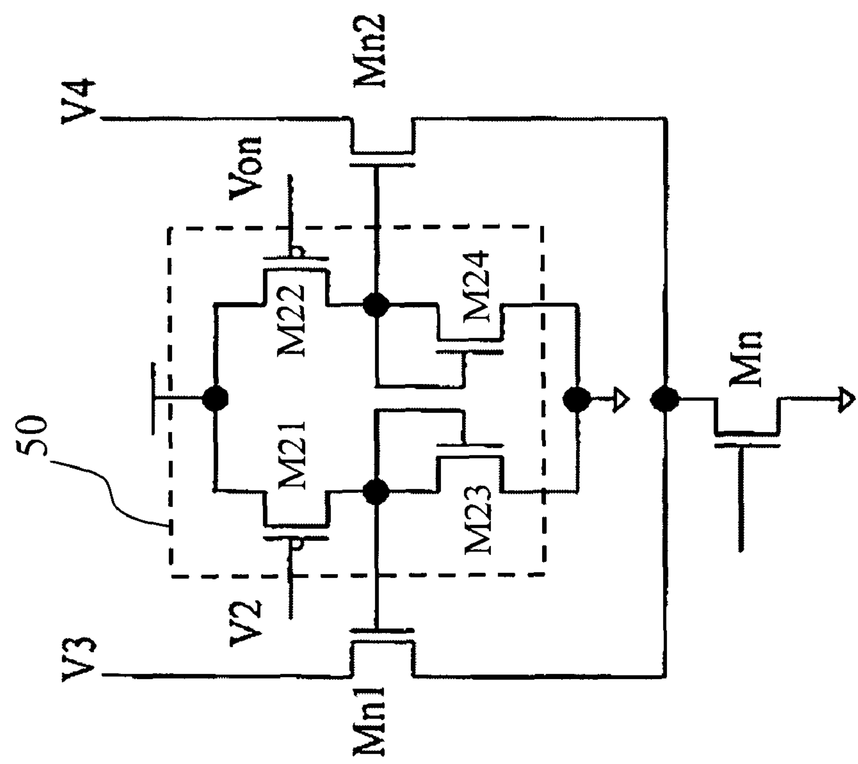

Refer to FIG. 3A and FIG. 3B diagrams schematically showing a fail-safe circuit of an LVDS receiver according to one embodiment of the present invention. Current sources Mn and Mp provides constant currents for the V2, V3, V4 and Von in FIG. 3A, and the V1, V2, V4 and Von in FIG. 3B, which are coupled to the V1, V2, V3, V4 and Von in FIG. 2. The values of the constant currents are determined by the required offset voltage.

The fail-safe circuit further includes: an input amplification circuit 50 and an input amplification circuit 60. The input amplification circuit 50 receives a bias signal generated by the bias point V2 and an output voltage signal Von to generate an amplification signal. The drains of current control elements Mn1 and Mn2 are respectively coupled to the gates of M7 and M8, the gate of M21 is coupled to the gate of M16, and the gate of M22 is coupled to the drain of M16. Then, according to the operating current and amplification signal, the current control elements Mn1 and Mn2 selectively generate two control currents to the bias points V3 and V4 respectively. Besides, an NMOS current source Mn provides an operating current for the input amplification circuit 50.

The input amplification circuit 60 receives a bias signal generated by the bias point V4 and an output voltage signal Von to generate an amplification signal. The drains of current control elements Mp1 and Mp2 are respectively coupled to the gates of M5 and M6; the gate of M25 is coupled to the gate of M15, and the gate of M26 is coupled to the drain of M15. Then, according to the operating current and amplification signal, the current control elements Mp1 and Mp2 generate two control currents to the bias points V1 and V2 respectively. Besides, a PMOS current source Mp provides an operating current for the input amplification circuit 60.

The differential voltage signals V2 and Von of the receiver are respectively input to M21 and M22 and respectively amplified by the single-stage amplifiers M23 and M24 to output voltages for controlling Mn1 and Mn2. The differential voltage signals V4 and Von of the receiver are respectively input to M25 and M26 and respectively amplified by the single-stage amplifiers M27 and M28 to output voltages for controlling Mp1 and Mp2.

Figure 4:
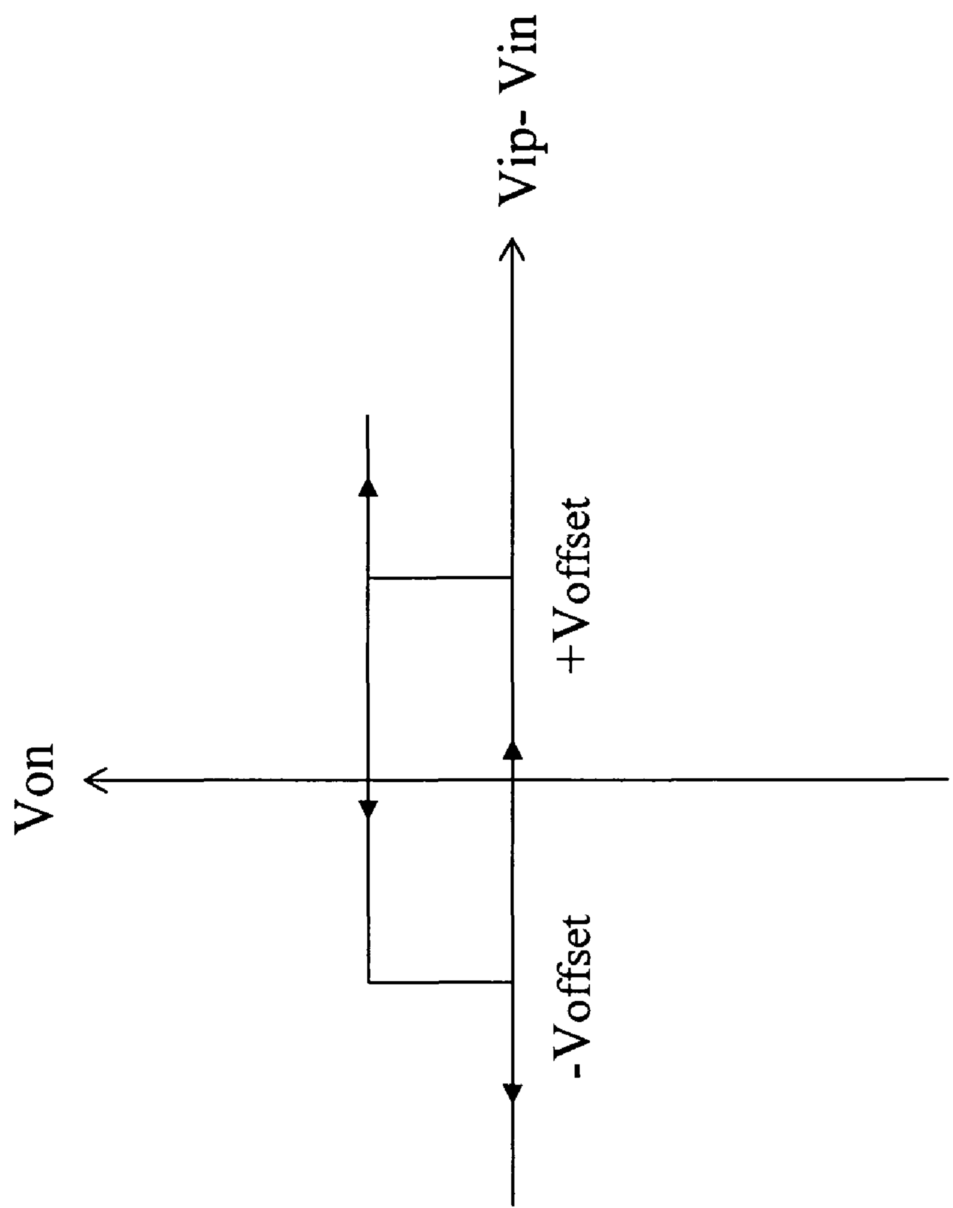
FIG. 4 is a diagram schematically showing the relationship between the difference of the input voltages and the output voltage of an LVDS receiver according to one embodiment of the present invention.

Refer to FIG. 4 a diagram schematically showing the relationship between the output voltage and the difference of the input voltages of an LVDS receiver according to one embodiment of the present invention. In the abovementioned circuit, when Vip is greater than Vin by an offset voltage $V_{offset}$, the currents flowing through M6 and M7 are respectively greater than the currents flowing through M5 and M8. Then, V2 is greater than Von, and Von is greater than V4. When V2 is greater than Von, Mn2 turns on, and Mn1 turns off; thus, the current flowing through Mn will flow through Mn2 to M8 to increase M8 current to the value of M7 current. Similarly, When Von is greater than V4, the value of M5 current is increased to the value of M6 current. Via the current mirror circuits M8 plus M15 and M6 plus M16, the total currents flowing through M15 and M16 are identical.

When Vip is greater than Vin by an offset voltage $+V_{offset}$, and the total currents flowing through M15 and M16 are identical, the voltage conversion of "Vip-Vin" and Von can be performed after a displacement of the offset voltage. When Vip is greater than Vin by an offset voltage $-V_{offset}$, and the total currents flowing through M15 and M16 are identical, the voltage conversion of "Vip-Vin" and Von can be performed after a displacement of the offset voltage. Thus, the offset voltage can vary with the constantly-varying Vip and Vin to overcome differential noise and maintain the duty-cycle integrity of the output terminal of the receiver.

In the present invention, amplifiers respectively amplify the differential voltages output by the receiver to control the switching of MOS elements and overcome differential noise without influencing the driving current output by the transmitter at another side.

In conclusion, the present invention uses both the NMOS input pair and the PMOS input pair to receive an input voltage signal and sense a full-range common-mode voltage signal. Further, an inverter is coupled to the output terminal of the receiver to pull up the amplified differential signal to a full range and then output it. Further, the receiver circuit is designed to have a self-bias function to save an additional bias circuit and reduce power consumption. Furthermore, the receiver of the present invention does not use a cascade circuit, which needs a greater Vdd operating voltage, but adopts current mirrors to transmit current signal. Therefore, the receiver of the present invention can operate at a lower voltage.

The embodiments described above are only to demonstrate the technical thoughts and characteristics of the present invention to enable the persons skilled in the art to understand, make, and use the present invention. However, it is not intended to limit the scope of the present invention. Any equivalent modification or variation according to the spirit of the present invention is to be also included within the scope of the present invention.

What is claimed is:

1. A low voltage differential signal receiver comprising:

an input stage circuit converting a low voltage differential signal into a first current signal and a second current signal, wherein said low voltage differential signal comprises a first input voltage signal and a second input voltage signal;

a current source circuit coupled to said input stage circuit and generating a set of operating currents required by said input stage circuit according to a plurality of bias signals;

a current mirror circuit coupled to said current source circuit and said input stage circuit, receiving said first current signal and said second current signal to generate an output voltage signal, and generating said bias signals to said current source circuit according to said first current signal and said second current signal, and a fail-safe circuit coupled to said current mirror circuit, wherein when an absolute value of difference of said first input voltage signal and said second input voltage signal is greater than a predetermined value, said fail-safe circuit switches said output voltage signal from an original first predetermined voltage value to a second predetermined voltage value; and when the absolute value of difference of said first input voltage signal and said second input voltage signal is less than said predetermined value, said fail-safe circuit maintains said output voltage signal at said first predetermined voltage value.

2. A low voltage differential signal receiver according to claim 1, wherein said input stage circuit further comprises:

a first differential signal input device converting said low voltage differential signal into said first current signal; and a second differential signal input device converting said low voltage differential signal into said second current signal, wherein a first predetermined range of a differential signal common-mode voltage, which said first differential signal input device receives, only partially overlap a second predetermined range of said differential signal common-mode voltage, which said second differential signal input device receives.

3. A low voltage differential signal receiver according to claim 2, wherein said first differential signal input device includes a first pair of PMOS transistors with two sources thereof coupled to each other and two gates thereof receiving said low voltage differential signal; said second differential signal input device includes a first pair of NMOS transistors with two sources thereof coupled to each other and two gates thereof receiving said low voltage differential signal.

4. A low voltage differential signal receiver according to claim 2, wherein said set of operating currents includes: a first set of operating currents and a second set of operating currents; said current source circuit further comprises:

a first current source circuit generating said first set of operating currents required by said first differential signal input device; and a second current source circuit generating said second set of operating currents required by said second differential signal input device.

5. A low voltage differential signal receiver according to claim 4, wherein said first current source circuit includes a second pair of PMOS transistors with two sources thereof coupled to a first predetermined voltage source and two drains thereof coupled to each other; said second current source circuit includes a second pair of NMOS transistors with two sources thereof coupled to a second predetermined voltage source and two drains thereof coupled to each other.

6. A low voltage differential signal receiver according to claim 4, wherein said current mirror circuit further comprises:

a first current mirror set arranged in between said first differential signal input device and said second differential signal input device and generating a first summation current signal according to said first current signal and said second current signal; and a second current mirror set arranged in between said first differential signal input device and said second differential signal input device and generating a second summation current signal according to said first current signal and said second current signal, wherein said current mirror circuit generates said output voltage signal according to said first summation current signal and said second summation current signal.

7. A low voltage differential signal receiver according to claim 6, wherein said first current signal includes: a third current sub-signal and a fourth current sub-signal; said second current signal includes: a fifth current sub-signal and a sixth current sub-signal; said first current mirror set includes:

a third current mirror receiving said third current sub-signal to generate a first mirroring current signal;

a fourth current mirror coupled to said third current mirror and generating said first summation current signal according to said sixth current sub-signal and said first mirroring current signal.

8. A low voltage differential signal receiver according to claim 7, wherein said plurality of bias signals includes: a first bias signal, a second bias signal, a third bias signal and a fourth bias signal; said third current mirror generates said first bias signal to said first current source circuit according to said third current sub-signal; said fourth current mirror generates said fourth bias signal to said second current source circuit according to said sixth current sub-signal and said first mirroring current signal.

9. A low voltage differential signal receiver according to claim 8, wherein said second current mirror set includes:

a fifth current mirror receiving said fifth current sub-signal to generate a second mirroring current signal;

a sixth current mirror coupled to said fifth current mirror and generating said second summation current signal according to said fourth current sub-signal and said second mirroring current signal.

10. A low voltage differential signal receiver according to claim 9, wherein said fifth current mirror generates said third bias signal to said second current source circuit according to said fifth current sub-signal; said sixth current mirror generates said second bias signal to said first current source circuit according to said fourth current sub-signal and said second mirroring current signal.

11. A low voltage differential signal receiver according to claim 10, wherein said third current mirror is coupled to said sixth current mirror; said fourth current mirror is coupled to said fifth current mirror; said fourth current mirror and said sixth current mirror are coupled to a coupling point.

12. A low voltage differential signal receiver according to claim 11, wherein said output voltage signal is output from said coupling point.

13. A low voltage differential signal receiver according to claim 1, wherein said current mirror circuit comprises: a first bias point generating a first bias signal, a second bias point generating second bias signal, a third bias point generating a third bias signal, and a fourth bias point generating a fourth bias signal; said fail-safe circuit comprises:

a third current source providing a third operating current;

a third input amplification circuit receiving said second bias signal and said output voltage signal to generate a set of third amplification signals; and a third current control element selectively generating a set of third control currents to said third bias point and said fourth bias point according to said third operating current and said set of third amplification signals.

14. A low voltage differential signal receiver according to claim 13, wherein said fail-safe circuit further comprises:

a fourth current source providing a fourth operating current;

a fourth input amplification circuit receiving said fourth bias signal and said output voltage signal to generate a set of fourth amplification signals; and a fourth current element control element selectively generating a set of fourth control currents to said first bias point and said second bias point according to said fourth operating current and said set of fourth amplification signals.

* * * * *